(12) United States Patent
Ang

(10) Patent No.: US 7,989,309 B2
(45) Date of Patent: Aug. 2, 2011

(54) METHOD OF IMPROVING A SHALLOW TRENCH ISOLATION GAPFILL PROCESS

(75) Inventor: Ting Cheong Ang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 631 days.

(21) Appl. No.: 11/549,116

(22) Filed: Oct. 13, 2006

(65) Prior Publication Data

US 2007/0254453 A1 Nov. 1, 2007

(30) Foreign Application Priority Data

Apr. 30, 2006 (CN) .......................... 2006 1 0026323

(51) Int. Cl.
*H01L 21/76* (2006.01)
(52) U.S. Cl. ........ 438/427; 438/296; 438/424; 438/701; 257/E21.54; 257/E21.546; 257/E21.574
(58) Field of Classification Search .................. 438/359; 257/E21.483, E21.574
See application file for complete search history.

(56) References Cited

U.S. PATENT DOCUMENTS

| 6,207,532 B1 | 3/2001 | Lin et al. |
| 6,833,602 B1 | 12/2004 | Mehta |
| 2001/0026980 A1* | 10/2001 | Mizuo ........................... 438/296 |
| 2003/0153136 A1* | 8/2003 | Matsumoto et al. .......... 438/151 |
| 2004/0157384 A1* | 8/2004 | Blanchard ..................... 438/197 |
| 2005/0196947 A1* | 9/2005 | Seo et al. ...................... 438/589 |
| 2007/0111546 A1* | 5/2007 | Iyer et al. ...................... 438/791 |

FOREIGN PATENT DOCUMENTS

CN 1531057 A 9/2004

OTHER PUBLICATIONS

Office Action of Chinese Application No. 200610026323.3., dated Apr. 4, 2008, 10 pages total (English translation not included).

* cited by examiner

*Primary Examiner* — Cheung Lee
(74) *Attorney, Agent, or Firm* — Kilpatrick Townsend and Stockton LLP

(57) ABSTRACT

A method of forming a graded trench for a shallow trench isolation region is provided. The method includes providing a semiconductor substrate with a substrate region. The method further includes forming a pad oxide layer overlying the substrate region. Additionally, the method includes forming an etch stop layer overlying the pad oxide layer. The method further includes patterning the etch stop layer and the pad oxide layer to expose a portion of the substrate region. In addition, the method includes forming a trench within an exposed portion of the substrate region, the trench having sidewalls and a bottom and a first depth. The method additionally includes forming a dielectric layer overlying the trench sidewalls, the trench bottom, and mesa regions adjacent to the trench. The method further includes etching the substrate region to increase the depth of at least a portion of the trench to a second depth.

13 Claims, 13 Drawing Sheets

METHOD OF IMPROVING A SHALLOW TRENCH ISOLATION GAPFILL PROCESS

CROSS-REFERENCES TO RELATED APPLICATIONS

This application claims priority to Chinese Patent Application No. 200610026323.3, filed Apr. 30, 2006, entitled "Method of Improving a Shallow Trench Isolation Gapfill Process" by inventor Ting Cheong Ang, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits and their processing for the manufacture of semiconductor devices. More particularly, the invention provides a method of trench formation with improved gapfill characteristics and a resulting device structure. Merely by way of example, the invention has been applied to the formation of shallow trench isolation (STI) regions. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. Additionally, as devices require faster and faster designs, process limitations exist with conventional processes and materials.

One such example of a process limitation deals with the difficulty of filling a trench that has a high aspect ratio, meaning that the ratio of the depth of the trench to the trench opening is large. A high aspect ratio can cause problems during the trench fill process in that the deposited material is not uniformly distributed over the surface area of the trench. This can lead to overhang of the deposited material at the trench corner and voids at the center of the trench, thus causing problems with device performance and electrical reliability.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method of trench formation with improved gapfill characteristics and a resulting device structure. Merely by way of example, the invention has been applied to the formation of shallow trench isolation (STI) regions. But it would be recognized that the invention has a much broader range of applicability.

In a specific embodiment of the present invention, a method of forming a graded trench for a shallow trench isolation region is provided. The method includes providing a semiconductor substrate with a substrate region. The method further includes forming a pad oxide layer overlying the substrate region. Additionally, the method includes forming an etch stop layer overlying the pad oxide layer. The method further includes patterning the etch stop layer and the pad oxide layer to expose a portion of the substrate region. In addition, the method includes forming a trench within an exposed portion of the substrate region, the trench having sidewalls and a bottom and a first depth. Furthermore, the method includes forming a dielectric layer overlying the trench sidewalls, the trench bottom, and mesa regions adjacent to the trench. The method further includes removing a first portion of the dielectric layer from the trench bottom to expose the substrate region with a second portion of the dielectric layer remaining on the sidewalls of the trench. In addition, the method includes etching the substrate region to increase the depth of at least a portion of the trench to a second depth. Also, the method includes removing the second portion of the dielectric layer from the trench.

In another specific embodiment of the present invention, A method of forming a shallow trench isolation region is provided. The method includes providing a semiconductor substrate with a substrate region. The method further includes forming a pad oxide layer overlying the substrate region. Additionally, the method includes forming an etch stop layer overlying the pad oxide layer. The method further includes patterning the etch stop layer and the pad oxide layer to expose a portion of the substrate region. In addition, the method includes forming a trench within an exposed portion of the substrate region, the trench having sidewalls and a bottom and a first depth. The method additionally includes forming a dielectric layer overlying the trench sidewalls, the trench bottom, and mesa regions adjacent to the trench. The method further includes removing a first portion of the dielectric layer from the trench bottom to expose the substrate region with a second portion of the dielectric layer remaining on the sidewalls of the trench. In addition, the method includes etching the substrate region to increase the depth of at least a portion of the trench to a second depth. Also, the method includes removing the second portion of the dielectric layer from the trench. Furthermore, the method includes depositing a second dielectric layer over the mesa regions and the trench. In addition, the method includes removing portions of the second dielectric layer to expose the etch stop layer. The method further includes removing the etch stop and pad oxide layers.

In yet another specific embodiment of the present invention, a trench located on and extending into the semiconductor substrate is provided. The trench includes a trench bottom and a trench opening. The trench further includes a first trench sidewall region. The trench additionally includes a first step region adjacent to the first trench sidewall region. The first step region is substantially parallel to the trench bottom and forms a first angle with the first trench sidewall region. Furthermore, the trench includes a second trench sidewall region. The second trench sidewall region forms a second angle with the trench bottom.

Many benefits are achieved by way of the present invention over conventional techniques. For example, the present technique provides an easy to use process that relies upon conventional technology. In some embodiments, an effective gapfill process is provided which reduce voiding within the deposited gapfill layer. This can improve the device reliability and performance of the semiconductor circuit being formed by providing superior electrical isolation. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method of trench formation with improved gapfill characteristics and a resulting device structure. Merely by way of example, the invention has been applied to the formation of shallow trench isolation (STI) regions. But it would be recognized that the invention has a much broader range of applicability.

Figure 1A:
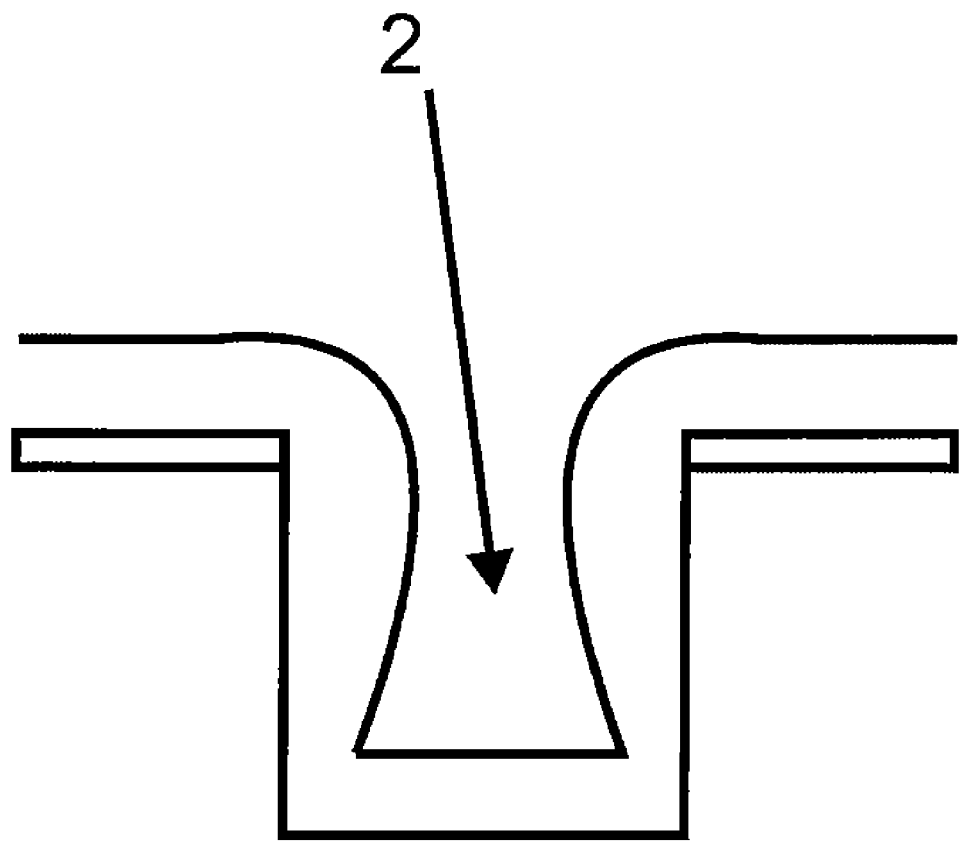
FIG. 1A is a simplified drawing showing void formation following a conventional deposition process.
Figure 1B:
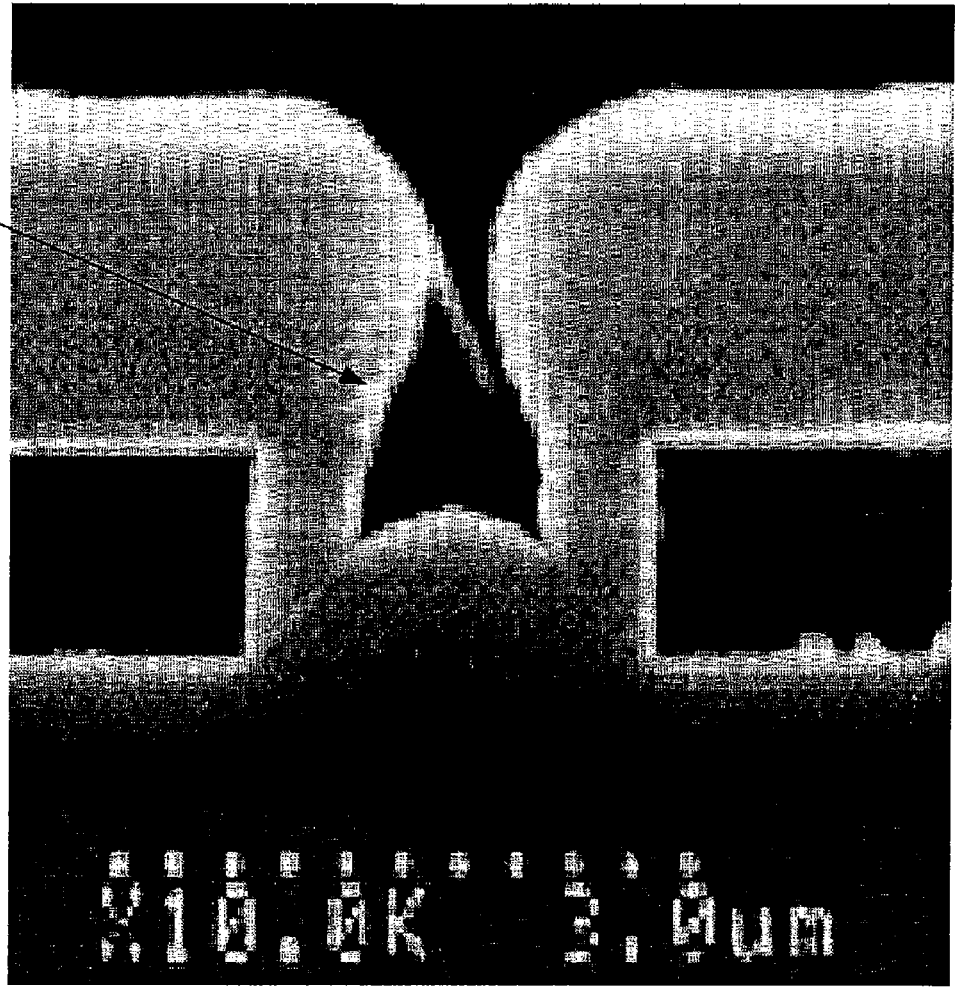
FIG. 1B is a SEM image of void formation in a conventional STI process.

FIG. 1A is a simplified drawing showing void formation in a conventional trench filling process and FIG. 1B is a SEM image of void formation in a conventional STI process. A deposition process is used to fill the high aspect ratio trenches formed within the substrate. For example, a high aspect ratio trench is a trench where the ratio of the trench depth to the trench width is greater than 5:1. A trench with exemplary dimensions of a trench opening of 12 microns and a depth of 5000 Å can incur a number of problems when performing a deposition process. One major problem that can occur is that overhang of the deposited material on the top corners of the trench can cause voids to form in the deposited material. For example, the inventor has discovered that this occurs because a larger amount of the deposited material collects on the corners of the trench instead of being evenly distributed throughout the trench. As material collects on the corners of the trench, it encroaches into the trench opening and causes more and more material to be deposited on the trench corners. More specifically, the trench aperture may have a reentrant angle whereby the upper width of the aperture is smaller than the bottom width of the trench. This causes voids 2 and 4 to form within the central portion of the trench, which can result in increased resistance in the deposited film, reliability problems of integrated circuits being formed by the structure of FIGS. 1A and 1B, and ultimately device failure that results in lowered yield rates of the process by which the integrated circuits are manufactured.

Figure 2A:
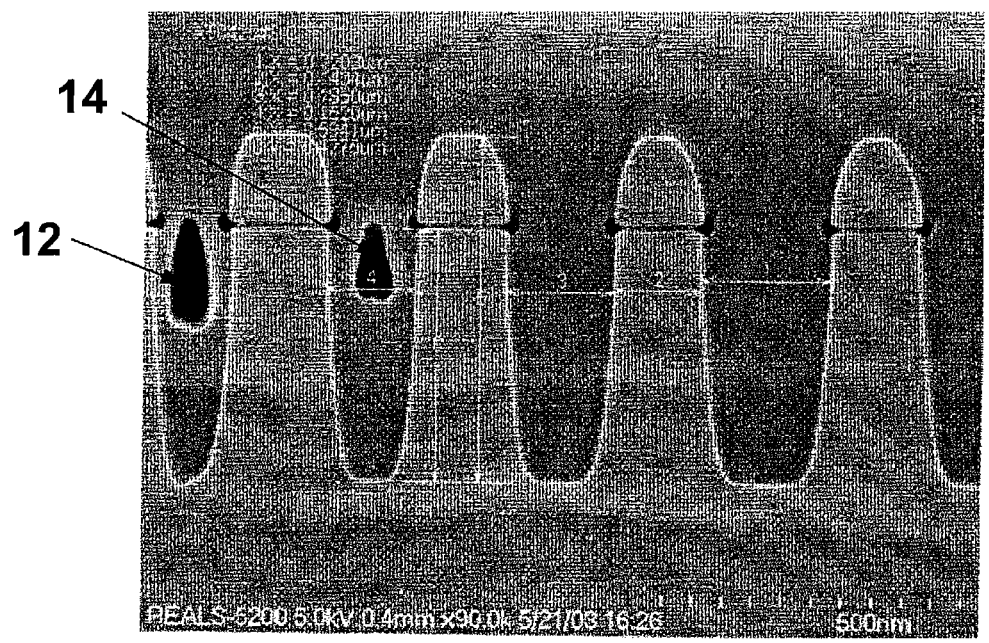
FIGS. 2A and 2B are SEM images showing void formation in a conventional STI process.
Figure 2B:
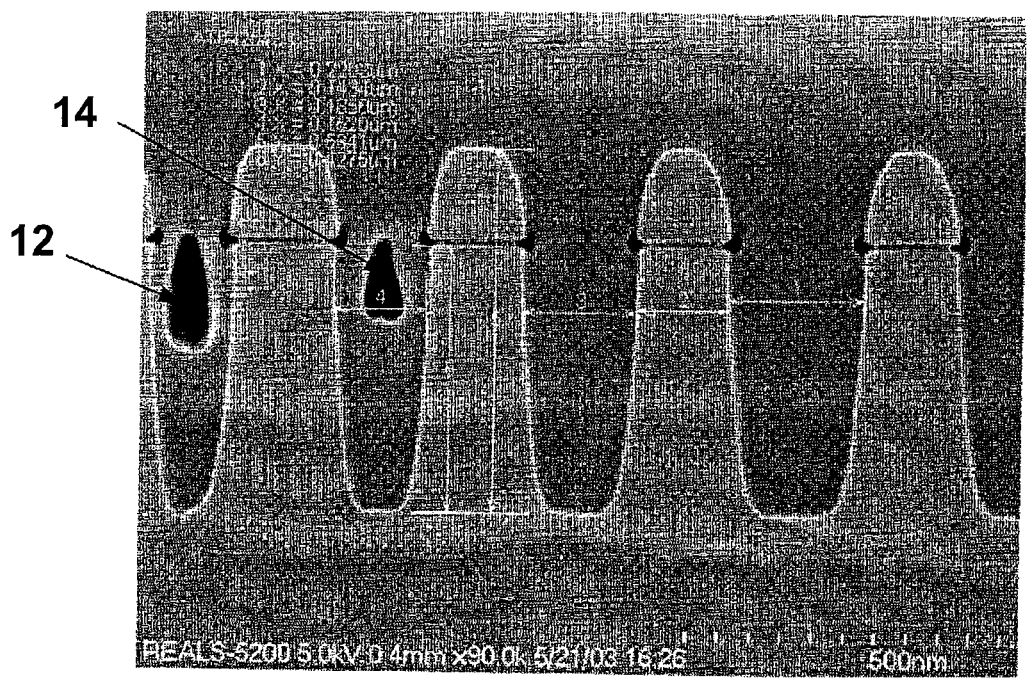

FIGS. 2A and 2B are SEM images showing void formation in a conventional STI process. An STI process is commonly used during wafer processing to electrically isolate adjacent transistors formed on a common semiconductor substrate. FIG. 2A is a center view and FIG. 2B is an edge view of the layers formed upon a semiconductor substrate. A single trench etch step is commonly used in the formation of the trenches. This results in the trenches having a conventional or 'steep' profile as a result of the trench formation process. For example, the sidewalls of the trench may have a slight continuous taper which results in the bottom of the trench being slightly narrower than the trench opening. After the gapfill or deposition process has been performed, voids 12 and 14 can occur as a result of overdeposition of the gapfill layer.

FIGS. 3A-3F are exemplary simplified diagrams showing trench formation for a STI gapfill process according to an embodiment of the present invention. These diagrams may be better understood in relation to FIG. 4, which is an exemplary simplified process flow showing processes used for trench formation for a STI gapfill process according to embodiments of the present invention. For example, process flow 200 includes process 202 for forming a trench opening, process 204 for performing a partial trench etch, process 206 for depositing a dielectric layer in the trench, process 208 for etching the dielectric layer to create spacers, process 210 for a second trench etch process, and process 212 for removing the spacers from the trench. These diagrams are merely examples, which should not unduly limit the scope of the claims. One of ordinary skill in the art would recognize many variations, alternatives, and modifications.

Figure 3A:
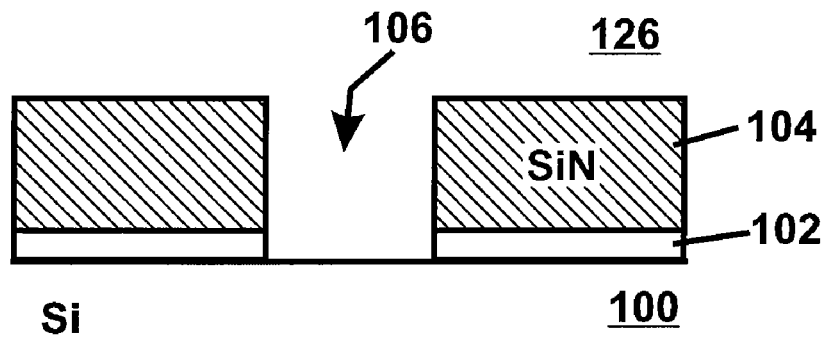
FIGS. 3A-3F are exemplary simplified diagrams showing trench formation for a STI gapfill process according to an embodiment of the present invention.
Figure 4:
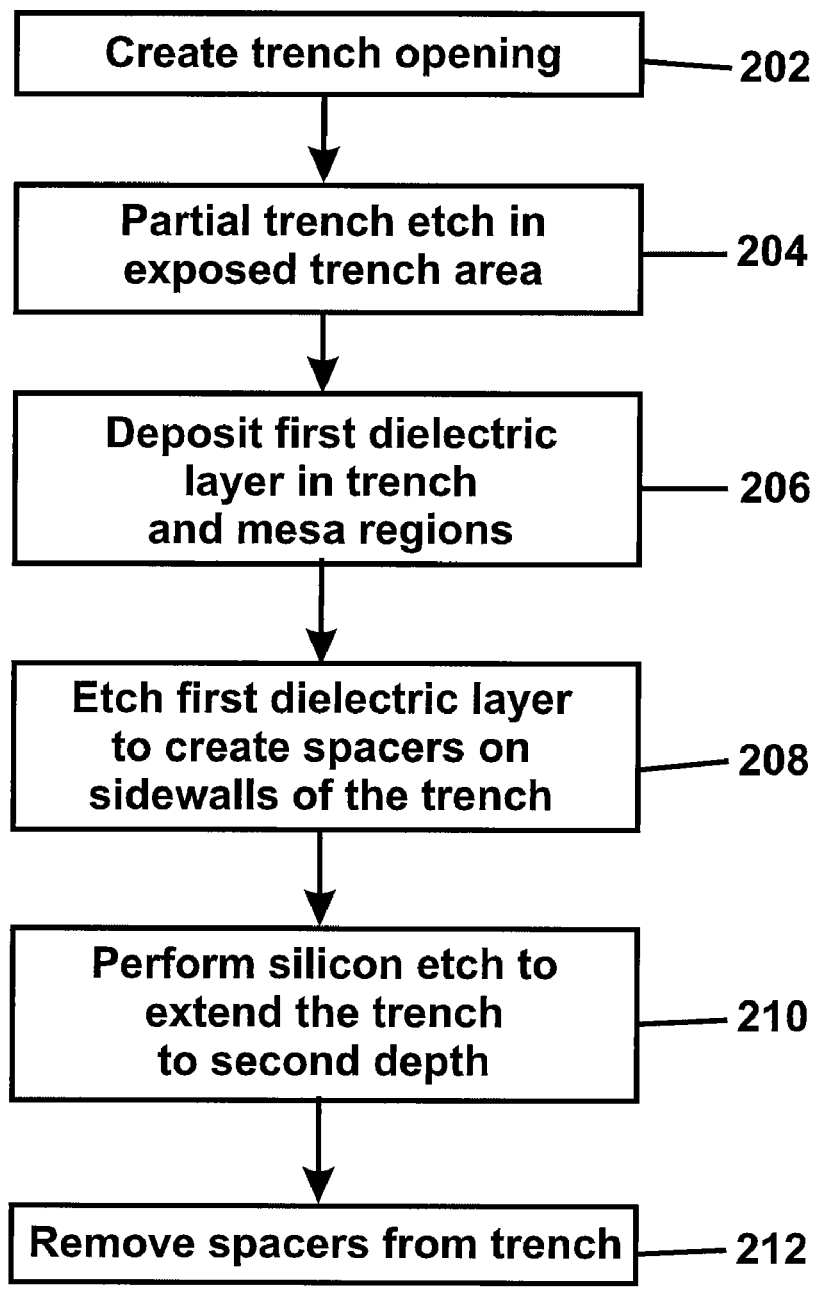
FIGS. 4-5 are exemplary simplified process flows showing processes used for trench formation for a STI gapfill process according to embodiments of the present invention.

In FIG. 3A, a semiconductor substrate 100 is provided. For example, the substrate may be formed from a silicon material suitable for semiconductor-grade electronics. A pad oxide layer 102 is then formed over semiconductor substrate 100.

Pad oxide layer 102 serves as a interface between adjoining hard mask layer 104 and semiconductor substrate 100. A thermal oxidation process may be used to form the pad oxide layer 102 on semiconductor substrate 100. Hard mask layer 104 is formed over pad oxide layer 102 and serves as a hard mask for the trench etch process. Additionally, hard mask layer 104 also serves as an stop layer for removal of the dielectric layer used as the isolation material in the STI structure. For example, hard mask layer 104 may be silicon nitride deposited using a CVD process. A lithography process is used to deposit and pattern photoresist on the silicon nitride layer to expose an opening so that a trench etch process can be performed. Etch processes are used to remove portions of hard stop layer 104 and pad oxide layer 102 to create trench opening 106 in process 202, which results in structure 126. Of course, there can be other variations, modifications, and alternatives.

Figure 3B:
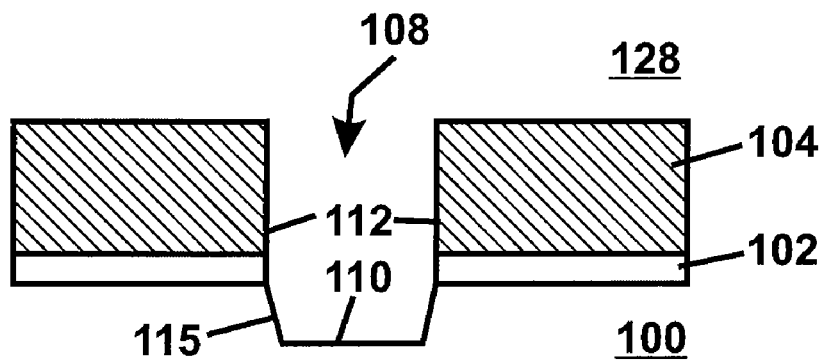

In process 204, a trench etch process is performed to etch the trench to a first depth which is a portion of the desired full depth of the trench. This is shown in FIG. 3B and structure 128. For example, the depth of the trench may be one-third to one-half the desired depth of the final trench. Conventional trench formation processes etch the entire depth of the trench in one etch process. The width of the trench may be 0.12 microns or smaller. Trench 108 possesses trench sidewalls 112 and trench bottom 110, and first sidewall regions 115. First sidewall regions 115 is a portion of trench sidewalls 112 that may possess a slight inwards angle due to the etching process. For example, the first trench angle of first sidewall regions 115 may be defined as being the angle formed between first sidewall region 115 and trench bottom 110. A range of angles may be achieved by the etching process from 90 degrees to 120 degrees. For example, a completely vertically etched trench will have an first trench angle of 90 degrees between sidewall region 115 and trench bottom 110. Alternatively, if the first trench angle is greater than 90 degrees, the width of trench bottom 110 may be less than the width of the trench opening. Of course, there can be other variations, modifications, and alternatives.

Figure 3C:
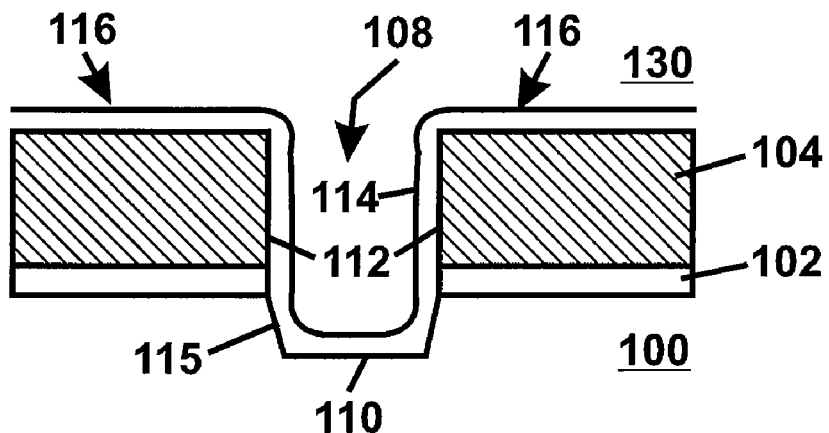

In FIG. 3C and process 206, a thin dielectric layer 116 is deposited in trench 108 and over mesa regions 116 adjacent to the trench. After deposition, structure 130 is formed. For example, the dielectric layer may be an nitride or oxide layer that has a thickness of between 50-500 Å. Dielectric layer 116 covers trench bottom 110, trench sidewalls 112, and mesa regions adjacent to the trench. Of course, there can be other variations, modifications, and alternatives.

Figure 3D:
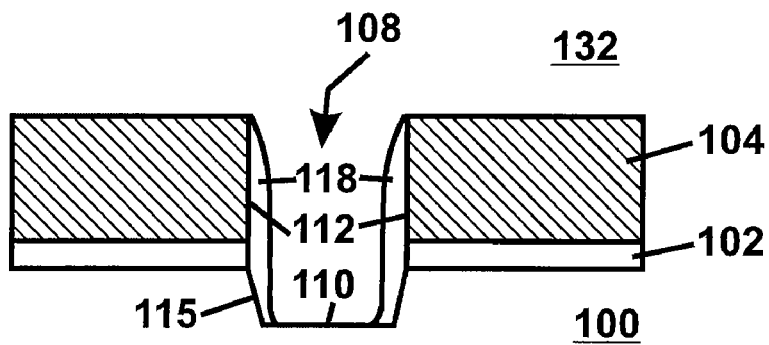

In process 208, dielectric layer 116 is etched to create spacers 118 on sidewalls 112 of trench 108 on structure 132, as shown in FIG. 3D. A dry anisotropic etch process may be used during process 208 to remove portions of dielectric layer 116. The etch process used has a substantially vertical orientation which removes portions of dielectric layer 116 from mesa regions 116 and trench bottom 110, while other portions of dielectric layer 116 remain on trench sidewalls 112 and first sidewall regions 115 as spacers 118. The substantially vertical orientation of the etch process may result in spacers 118 having a reduced thickness at the top, resulting in a sloped profile. A portion of dielectric layer 116 is removed from trench bottom 110, but spacers 118 remain on the sides of trench bottom 110 adjacent to trench sidewalls 112. This enables the remaining portions of dielectric layer 116 to function as spacers for a subsequent etch process to fully etch trench 108 to its desired depth, as the semiconductor substrate area underneath the spacers is not etched during a subsequent etch process. Of course, there can be other variations, modifications, and alternatives.

Figure 3E:
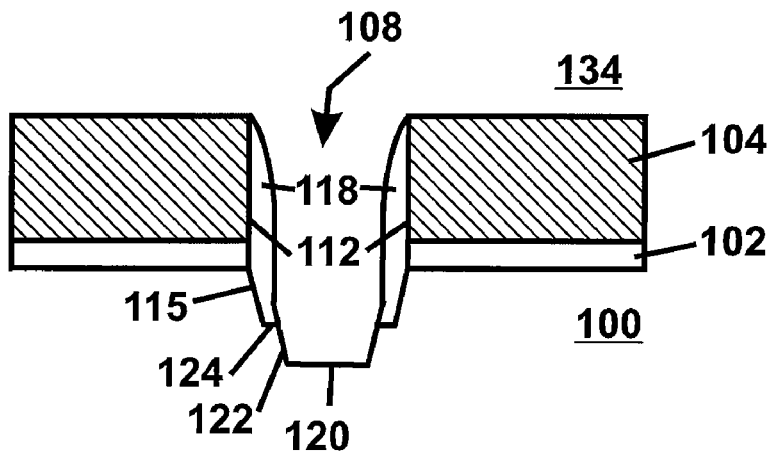
Figure 3F:
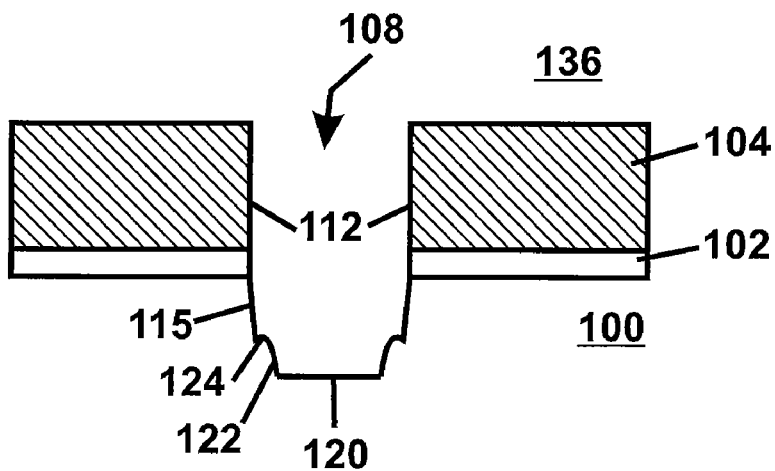

In process 210, a silicon etch process is used to further etch the trench into semiconductor substrate 100. This is shown in FIG. 3E and structure 134. As spacers 118 cover a portion of trench bottom 110 prior to the silicon etch process, only the exposed portion of trench bottom 110 is etched. The depth of trench 108 may be extended in process 210 to the desired final depth of trench 108. For example, if the trench was etched to one-third of the desired final depth in process 204, process 210 would etch the trench the additional two-thirds of the desired depth to meet the final depth. As a result of the etch process, the bottom of the trench 120 has been extended and narrowed by the silicon etch process and the use of spacers 118. Step regions 124 may be formed adjacent to first sidewall regions 115, which were previously part of trench bottom 110. Step regions 124 may possess a horizontal component, as step regions 124 were covered by spacers 118 during the silicon etch process. Correspondingly, the silicon regions below step regions 124 were not removed. For example, step regions 124 may be substantially parallel to trench bottom 120. Second sidewall regions 122 are formed during the silicon etch process and are adjacent to step regions 124 and recently formed trench bottom 120. Third sidewall regions 124 may possess a slight inwards angle due to the etching process, which may be different from the inwards angle of first sidewall regions 115. In addition, trench bottom 120 is narrower than previous trench bottom 110, which included step regions 124 in its width. Of course, there can be other variations, modifications, and alternatives.

Following the second etch process, the first trench angle may be defined as the angle between first sidewall region 115 and step region 124, as step region 124 was previously part of trench bottom 110. The second trench angle may be defined as the angle between second sidewall region 122 and trench bottom 120. The second trench angle may have an angle between 90 degrees and 120 degrees. In a specific embodiment, the first and second trench angles may both be 90 degrees, thus forming two right angles within the trench. However, the first and second trench angles may also be different values, leading to a trench with sidewalls of different slopes.

In process 212, spacers 118 are removed from trench 108. The result of this process can be shown in FIG. 3F and structure 136. A dry etch process is used in process 212 to remove spacers 118 from trench sidewalls 112 and first sidewall regions 15. For example, the etch process may be angled to allow for more efficient removal of spacers 118 as opposed to a substantially vertical etch process. Once spacers 118 are removed, trench sidewalls 112 includes first sidewall regions 115, step regions 124, and second sidewall regions 122. Second sidewall regions 122 are adjacent to trench bottom 120, which has a reduced width compared to trench bottom 110 in prior steps. In a specific embodiment of the present invention, the trench may have a width of less than 0.12 microns and a depth of less than 6000 Å. Trench sidewalls 112 possess a graded profile to reduce the amount of material that needs to be filled in the lower corners of trench 108. The inventor has discovered that by reducing the amount of material that needs to be filled in the lower bottom corners of the trench, the amount of voiding that occurs within the trench can be reduced. The inventor has theorized that as less material is deposited in the bottom corners of the trench during a subsequent deposition process, less material is also deposited on the sidewalls and top corners of the trench. This results in an enlarged trench opening which is more easily filled in a subsequent trench deposition process, which reduces the formation of voids. Of course, there can be other variations, modifications, and alternatives.

Figure 5:
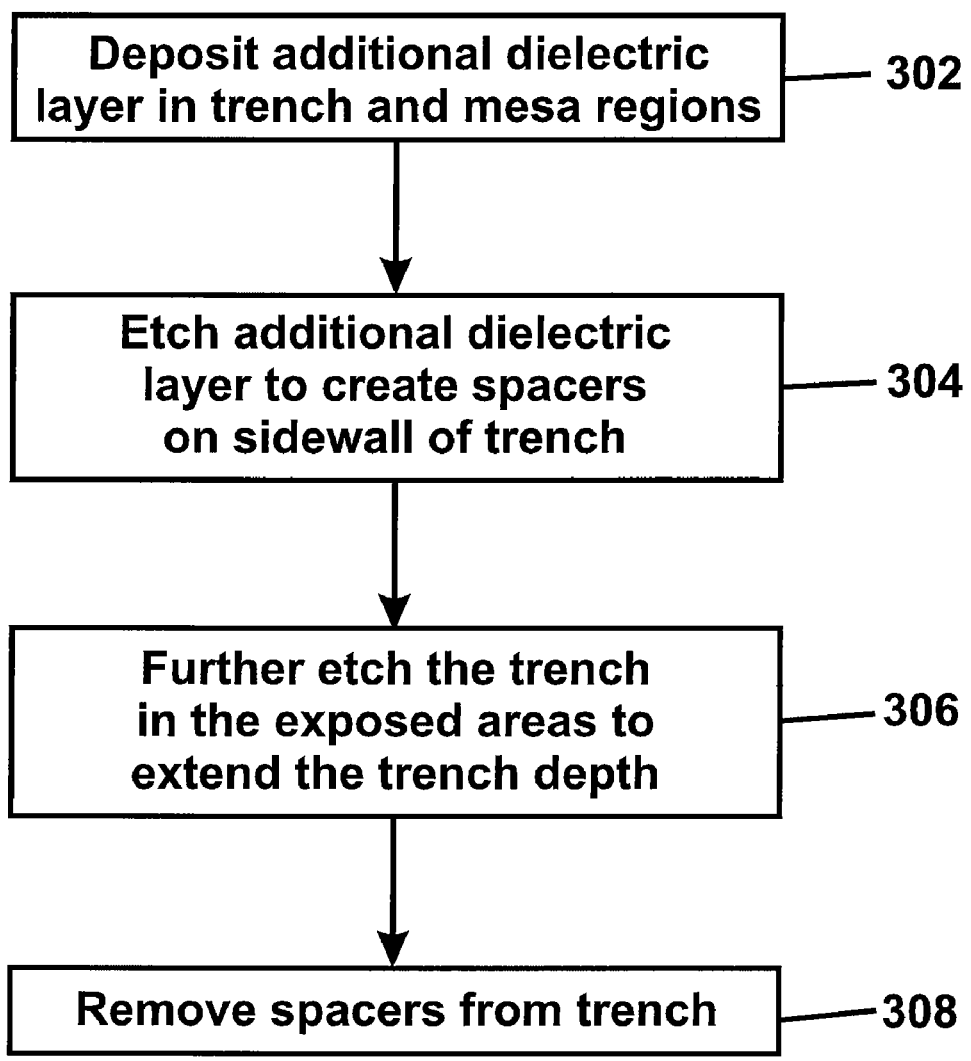

FIG. 5 is an exemplary simplified process flow showing processes used for trench formation for a STI gapfill process according to embodiments of the present invention. FIG. 5 may be better understood in regards to FIG. 6, which is an exemplary simplified diagram showing a trench having a graded profile according to an embodiment of the present invention. For example, process flow 300 includes process 302 for depositing an additional dielectric layer in the trench and mesa regions, process 304 for etching the additional dielectric layer to create spacers on the sidewalls of the trench, process 306 for further etching the trench in the exposed areas to extend the trench depth, and process 308 for removing the spacers from the trench. These diagrams are merely examples, which should not unduly limit the scope of the claims. One of ordinary skill in the art would recognize many variations, alternatives, and modifications.

Following process flow 200, structure 136 was formed with a two-step graded profile. Process flow 300 may be used after process flow 200 to create additional steps on the trench profile to further decrease the occurrence of voiding during the trench fill process. As can be appreciated, many of the steps in process flow 300 are similar to those of process flow 200. However, if process flow 300 is used, the depth of the trenches created by prior trench etch processes may need to be modified. For example, if one additional step is to be formed in the trench profile by process flow 300, an exemplary depth of one-quarter to one-third the trench may be etched in process 204 instead of one-third to one-half the depth of the final trench for a two-step trench etch in process 204. The remainder of the trench depth can be etched in processes 208 and process 306. For example, process 208 could extend the trench to a depth of one-half to two-thirds the final desired trench depth, with process 306 extending the trench to its final depth. The desired trench depths created by each trench etch process may be different depending on the number of steps to be formed on the trench profile. Of course, there can be other variations, modifications, and alternatives.

In process 302, an additional dielectric layer is deposited in the trench and mesa regions, similar to process 206. In this case, the dielectric layer covers the graded profile of the trench as well as covering the mesa regions and trench bottom. In process 304, the additional dielectric layer is etched to create spacers on the sidewalls of the trench. The spacers cover both the first and second sidewalls of the trench, as well as the step region in between. The spacers also cover a portion of the trench bottom, thus exposing a reduced width of the trench bottom to a subsequent etch process. In process 306, a silicon etch process is used to extend the trench to a further depth. Only the exposed area in the trench bottom is etched, as the portion of the trench bottom covered by spacers is not etched. In process 308, the spacers are removed from the trench, resulting in structure 400. Pad oxide layer 402 and hard mask layer 404 overly semiconductor substrate 440, with trench 408 formed in semiconductor substrate 440. Trench sidewalls 412 extend into the semiconductor substrate 440 and further include first sidewall regions 415, second sidewall regions 422, and third sidewall regions 428. First step regions 424 are present between first sidewall regions 415 and second sidewall regions 422, and second sidewall regions 426 are present between second sidewall regions 422 and third sidewall regions 428. Third sidewall regions 428 are also adjacent to trench bottom 420, which has a reduced width when compared to the trench opening for trench 408. Of course, there can be other variations, modifications, and alternatives.

Figure 6:
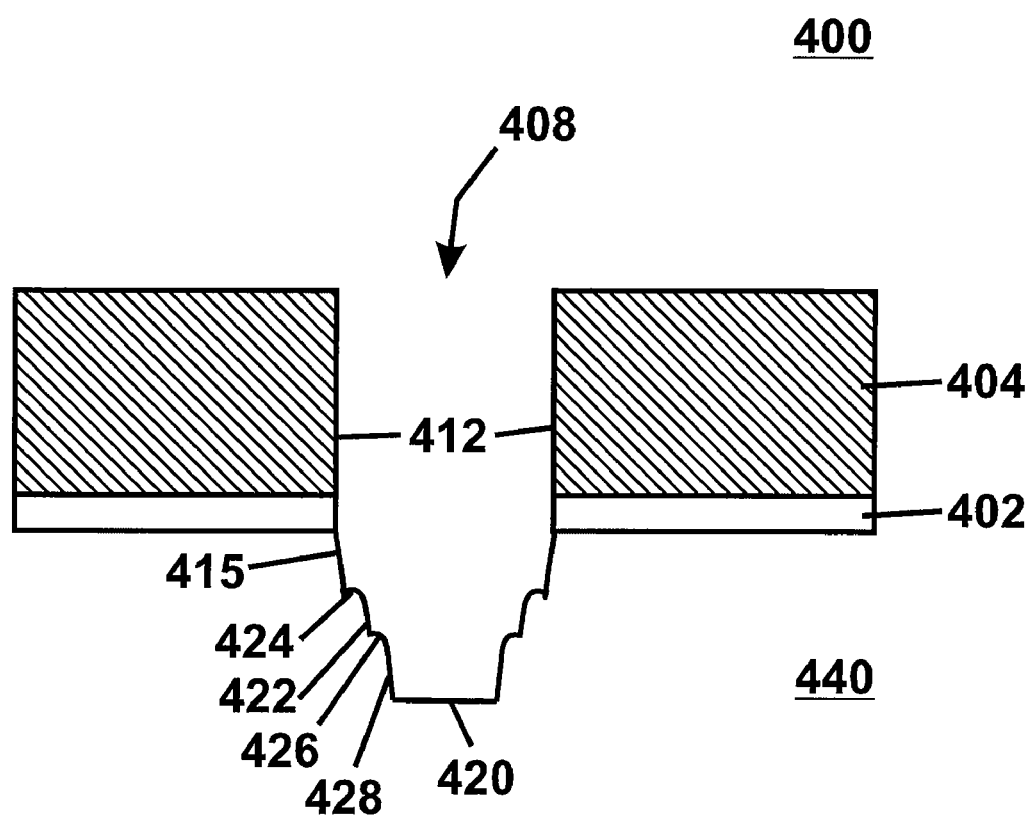
FIG. 6 is an exemplary simplified diagram showing a trench having a graded profile according to an embodiment of the present invention.

Comparing structure 400 in FIG. 6 to structure 136 in FIG. 3E, it can be appreciated that a reduced amount of material needs to be deposited within trench 408 as compared to trench 108 to fill the trench and create an isolation region. However, additional process steps are required to form structure 400 as opposed to structure 136. In addition, additional steps may be performed to created additional steps on the graded profile of the trench beyond that shown in FIG. 400 as needed. Of course, there can be other variations, modifications, and alternatives.

Figure 7A:
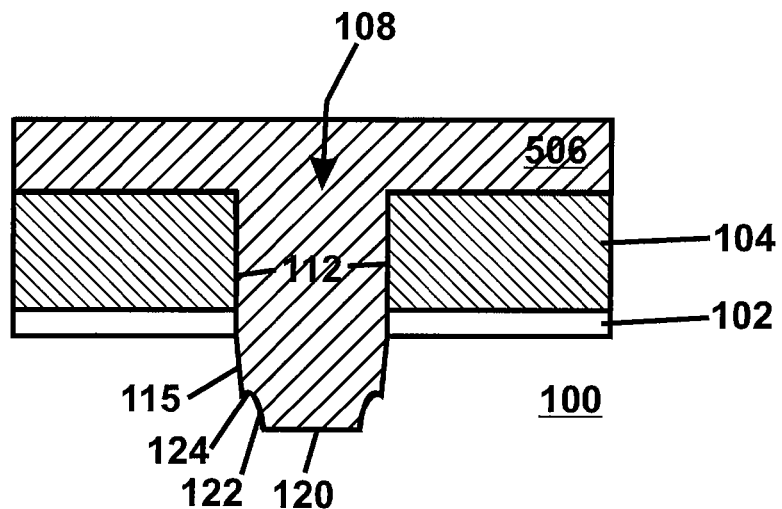
FIGS. 7A-7C are exemplary simplified diagrams showing additional deposition and removal processes in an STI gapfill process to an embodiment of the present invention.
Figure 7B:
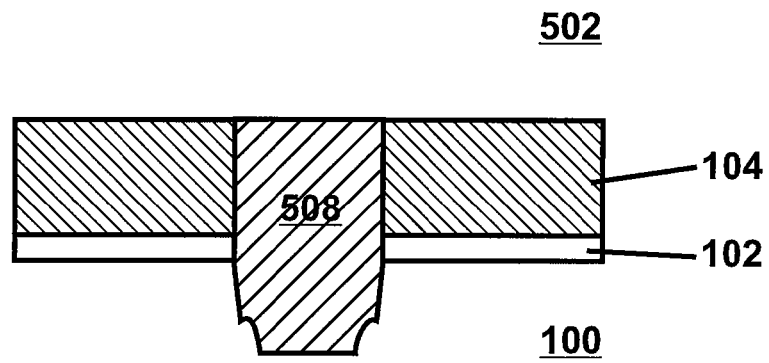
Figure 7C:
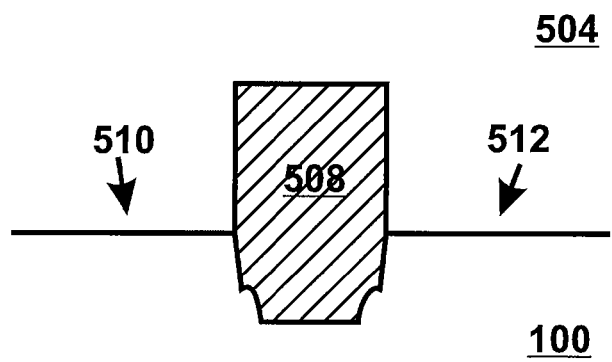
Figure 8:
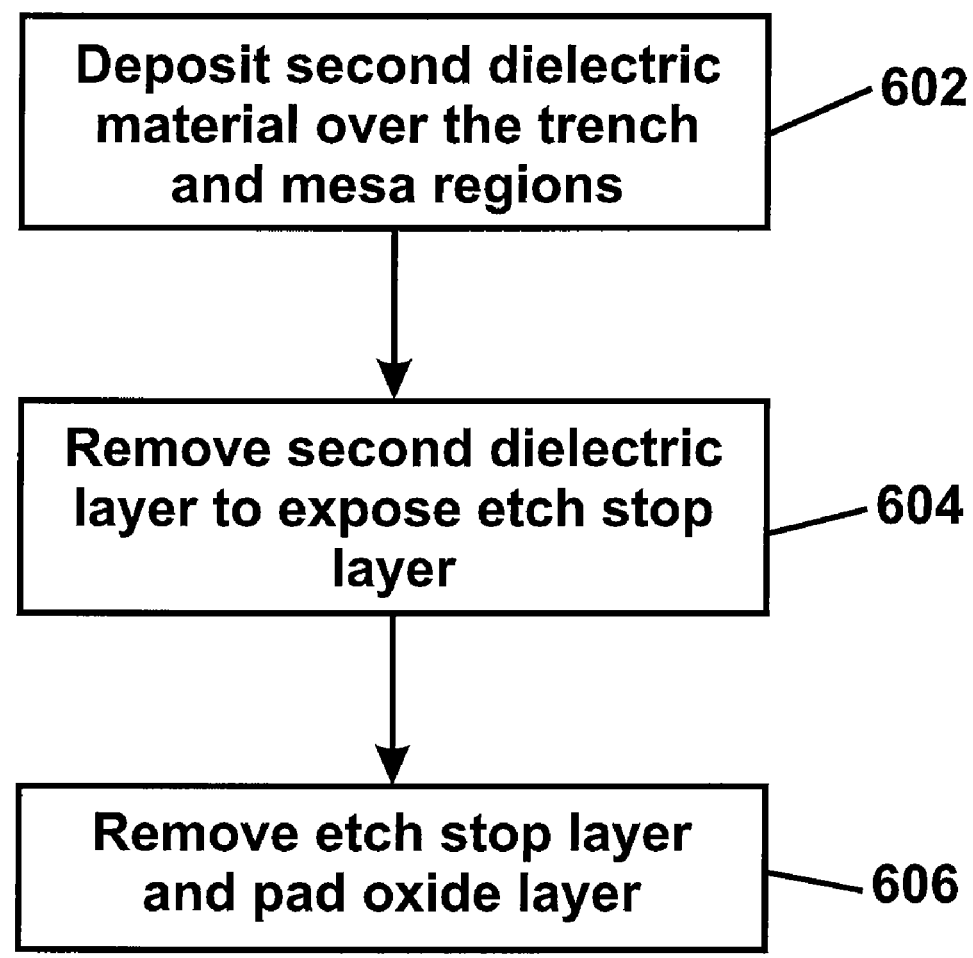
FIG. 8 is an exemplary simplified process flow showing additional processes used during trench formation for a STI gapfill process according to embodiments of the present invention.

FIG. 7A-7C are exemplary simplified diagrams showing additional deposition and removal processes in an STI gapfill process to an embodiment of the present invention. FIGS. 7A-7C may be better understood in regards to FIG. 8, which is an exemplary simplified process flow showing additional processes used during trench formation for a STI gapfill process according to embodiments of the present invention. Process flow 600 includes process 602 for depositing a second dielectric material over the trench and mesa regions, process 604 for removing the second dielectric layer to expose the etch stop layer, and process 606 for removing the etch stop layer and pad oxide layer. Process flow 600 can follow process flow 200 or process flow 300 to fill the graded trench created by previous process flows 200 or 300. These diagrams are merely examples, which should not unduly limit the scope of the claims. One of ordinary skill in the art would recognize many variations, alternatives, and modifications.

In process 602, a second layer of dielectric material 108 is deposited over the trench 108 and mesa regions adjacent to the trench. For example, an HDP-CVD or other process can be used to deposit a layer of silicon oxide or other dielectric material to fill trench 108. Second layer of dielectric material 108 additionally covers trench bottom 120 and sidewall regions 112, encompassing first and second sidewall regions 115 and 122, and step region 124. The graded profile of the sidewall regions allows for a reduced amount of material to collect on the upper corners of trench 108, thus reducing or preventing void formation from occurring. The second dielectric layer 108 additionally covers the hard mask layer 104 adjacent to the trenches. While a two-step graded trench has been filled in structure 500, trenches with additional steps could also be filled by process 602. For example, a three-or four step graded trench could also be filled. Of course, there can be other variations, modifications, and alternatives.

In process 604, second dielectric layer 506 is removed to expose etch stop layer 104 adjacent to the trench region. For example, a chemical-mechanical polishing (CMP) process may be used to planarize second dielectric layer 506 until etch stop layer 104 is exposed. Etch stop layer 104 serves as an etch stop allowing for the proper height of isolation region 508 to be formed. For example, if a greater height of isolation region 508 is desired, the corresponding height of etch stop layer 104 can be increased during the deposition of etch stop layer 104. Of course, there can be other variations, modifications, and alternatives.

In process 606, etch stop layer 104 and pad oxide layer 102 are removed. Wet etch processes may be used to remove etch stop layer 104 and pad oxide layer 102. The chemistry of the wet etch processes may be tailored to avoid etching into isolation region 508. Process 606 continues until etch stop layer 104 and pad oxide layer 102 are removed and semiconductor substrate 100 adjacent to isolation region 508 are exposed. Substrate areas 510 and 512 are located in semiconductor substrate 100 and are adjacent to isolation region 508 and can be used for transistor formation in subsequent steps, with isolation region 508 serving to isolate substrate areas 510 and 512 from each other. Of course, there can be other variations, modifications, and alternatives.

Figure 9:
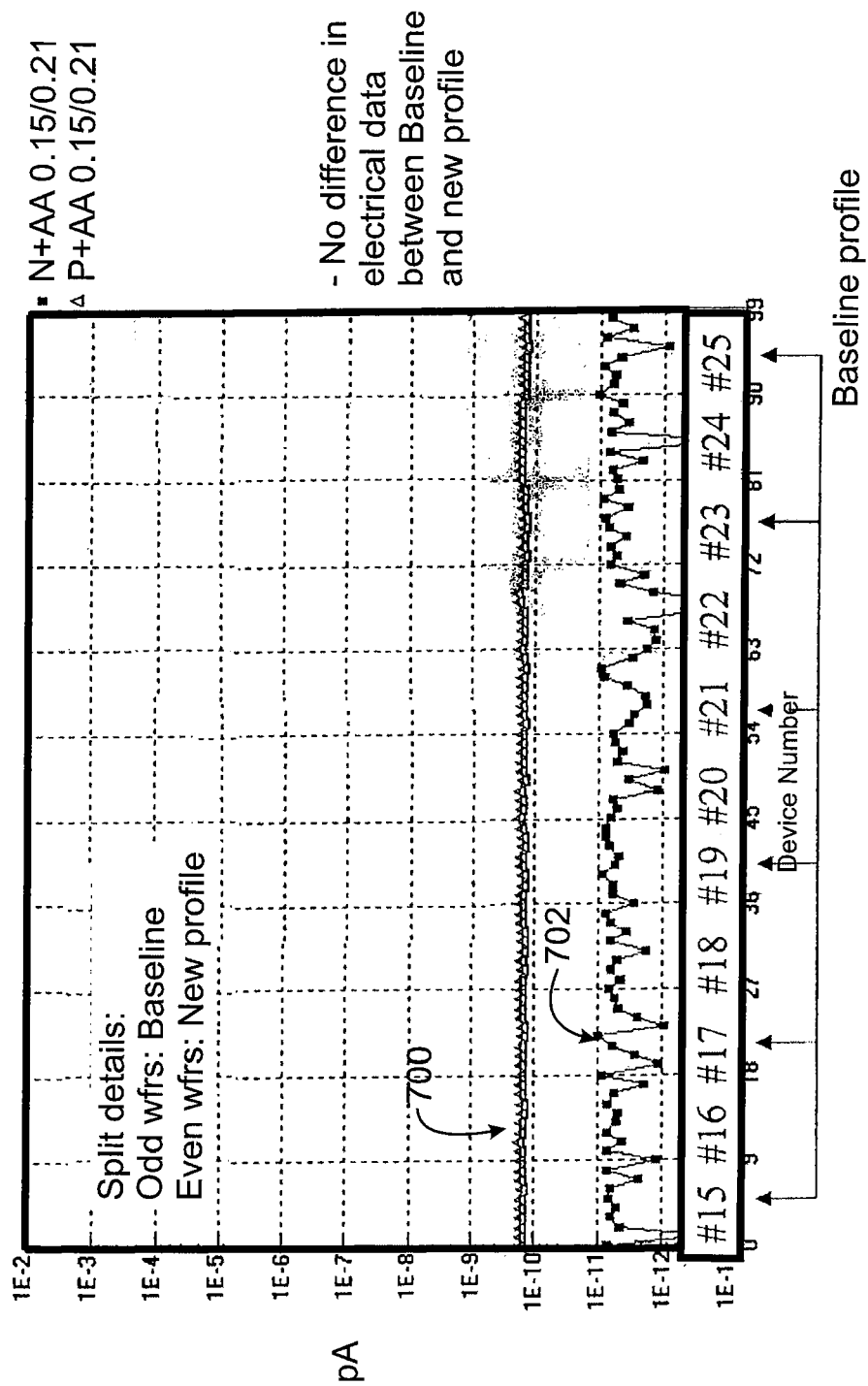
FIG. 9 is an exemplary figure showing electrical testing of trenches for an STI gapfill process according to an embodiment of the present invention.

FIG. 9 is an exemplary figure showing electrical testing of trenches for an STI gapfill process according to an embodiment of the present invention. In FIG. 9, baseline electrical data is shown for a split lot of wafers for a conventional profile trench and a graded profile trench. The odd wafers utilized a one-step etch to create and fill the trench, while the even wafers utilized a method according to an embodiment of the present invention to create and fill a graded profile trench. The electrical data for the wafers is measured in terms of pico-amps, or the electrical current present between sections of silicon separated by the isolation regions. The acceptable baseline 700 for the current is shown at slightly above 1e–10 pA, with no difference between the electrical data 702 for trenches possessing a conventional profile and trenches possessing a graded profile according to embodiments of the present invention. For this reason, the electrical isolation offered by isolation regions created according to embodiments of the present invention is equal to that of isolation regions formed according to conventional methods, while also improving void reduction. Of course, there can be other variations, modifications, and alternatives.

Figure 10A:
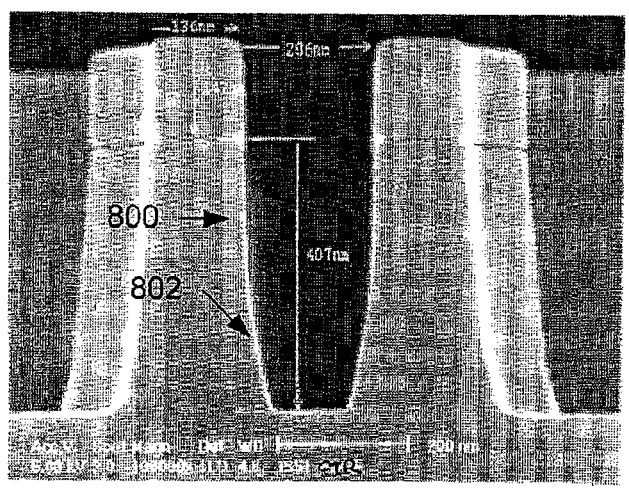
FIGS. 10A and 10B are exemplary SEM images showing a trench having a graded profile according to an embodiments of the present invention.
Figure 10B:
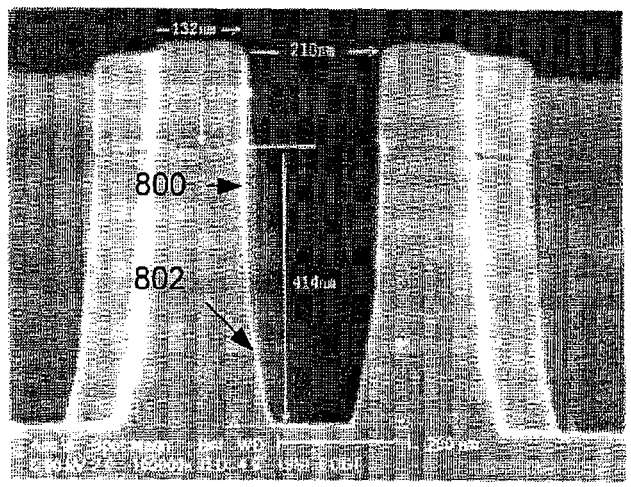

FIGS. 10A and 10B are exemplary SEM images showing a trench having a graded profile according to embodiments of the present invention. FIG. 10A is a center view and FIG. 10B is an edge view of the layers formed upon a semiconductor substrate. A graded trench has been formed and filled to create an isolation region in an STI gapfill process. However, when compared to FIGS. 2A and 2B, voids 12 and 14 do not occur after the gapfill process due to the formation of the graded trench according to embodiments of the present invention. In addition, the different slopes of first sidewall region 800 and second sidewall region 802 can be more clearly seen. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a graded trench for a shallow trench isolation region comprising:
    providing a semiconductor substrate with a substrate region;
    forming a pad oxide layer overlying the substrate region;
    forming an etch stop layer overlying the pad oxide layer;
    patterning a photoresist layer overlying the etch stop layer;
    etching a portion of the etch stop layer and a portion of the pad oxide layer using the patterned photoresist layer to expose a surface region of a portion of the substrate region;
    forming a trench within the portion of the substrate region, the trench having first sidewalls and a bottom and a first depth;
    forming a dielectric layer overlying at least the first trench sidewalls, the trench bottom, and mesa regions adjacent to the trench;
    removing a first portion of the dielectric layer from the trench bottom to expose a bottom substrate region while a second portion of the dielectric layer remaining on the first sidewalls of the trench;
    etching the exposed bottom substrate region to increase the depth of at least a portion of the trench to a second depth and to expose second sidewalls of the trench, the second portion of the dielectric layer remaining on the first sidewalls of the trench being a masking layer,
    removing the second portion of the dielectric layer from the trench to expose the first sidewalls and the second sidewalls;
    forming a second dielectric layer overlying the exposed first and second sidewalls, the trench bottom, and the mesa regions adjacent to the trench;
    removing a first portion of the second dielectric layer from the trench bottom to expose the substrate region with a second portion of the second dielectric layer remaining on the first and the second sidewalls of the trench;
    etching the substrate region to increase the depth of at least a portion of the trench to a third depth, and
    removing the second portion of the second dielectric layer from the trench.

2. The method of claim 1 wherein the second portion of the dielectric layer blocks a portion of the trench from being removed during the etching the substrate region.

3. The method of claim 1 wherein the second portion of the dielectric layer extends to the bottom of the trench prior to the etching the substrate region.

4. The method of claim 1 wherein the removing a portion of the dielectric layer is performed using an anisotropic etch process.

5. The method of claim 1 wherein the first depth is one-third to one-half of a final desired depth of the trench.

6. The method of claim 1 wherein the first depth is one-quarter to one-third of a final desired depth of the trench.

7. The method of claim 1 wherein the width of the trench is smaller than 0.12 microns.

8. The method of claim 1 wherein the trench depth is between 3000 and 6000 Å.

9. The method of claim 1 wherein the pad oxide layer is silicon oxide.

10. The method of claim 1 wherein the etch stop layer is silicon nitride.

11. The method of claim 1, further comprising:
    depositing a third dielectric layer over the mesa regions and the exposed trench;
    removing portions of the third dielectric layer to expose the etch stop layer and leaving a remaining portion of the third dielectric layer in the trench; and
    forming a free-standing dielectric structure protruding from the substrate by removing the etch stop and pad oxide layers adjacent to the remaining portion of the third dielectric layer.

12. A method of forming a graded trench for a shallow trench isolation region comprising:
    providing a semiconductor substrate with a substrate region;
    forming a pad oxide layer overlying the substrate region;
    forming an etch stop layer overlying the pad oxide layer;
    patterning the etch stop layer and the pad oxide layer to expose a portion of the substrate region;
    forming a trench within an exposed portion of the substrate region, the trench having first sidewalls and a bottom and a first depth;
    forming a dielectric layer overlying the trench sidewalls, the trench bottom, and mesa regions adjacent to the trench;
    removing a first portion of the dielectric layer from the trench bottom to expose the substrate region with a second portion of the dielectric layer remaining on the first sidewalls of the trench;
    etching the substrate region to increase the depth of at least a portion of the trench to a second depth and to expose second sidewalls of the trench, such that the second sidewalls have a different slope than the first sidewalls;

forming a graded trench by removing the second portion of the dielectric layer from the trench and to expose the first sidewalls and the second sidewalls;

forming a second dielectric layer overlying the exposed first and second sidewalls, the trench bottom, and the mesa regions adjacent to the trench;

removing a first portion of the second dielectric layer from the trench bottom to expose the substrate region with a second portion of the second dielectric layer remaining on the first and the second sidewalls of the trench;

etching the substrate region to increase the depth of at least a portion of the trench to a third depth, and removing the second portion of the second dielectric layer from the trench.

13. The method of claim 12, further comprising:

depositing a third dielectric layer over the mesa regions and the exposed trench;

removing portions of the third dielectric layer to expose the etch stop layer and leaving a remaining portion of the third dielectric layer in the trench; and forming a free-standing dielectric region protruding from the substrate by removing the etch stop and pad oxide layers adjacent to the remaining portion of the third dielectric layer.

* * * * *